United States Patent [19]

Bullock et al.

[11] 4,156,935
[45] May 29, 1979

[54] BLOCK REPLICATE MAGNETIC BUBBLE MEMORY CIRCUIT FOR HIGH SPEED DATA READOUT

[75] Inventors: David C. Bullock; Robert E. Fontana, Jr., both of Dallas; James T. Carlo, Richardson; Shalendra K. Singh, Dallas, all of Tex.

[73] Assignee: Texas Instruments Incorporated, Dallas, Tex.

[21] Appl. No.: 795,475

[22] Filed: May 10, 1977

[51] Int. Cl.² ............................................. G11C 19/08
[52] U.S. Cl. ..................................... 365/15; 365/12; 365/33; 365/39
[58] Field of Search ................... 340/174 TF; 365/12, 365/15

[56] References Cited

U.S. PATENT DOCUMENTS 4,007,453  2/1977  Bonyhard et al. ............ 340/174 TF

OTHER PUBLICATIONS

AIP Conference Proceedings, "64K Fast Access Chip Design" No. 29, Dec. 9-12, 1975, pp. 51-53.

Primary Examiner—James W. Moffitt
Attorney, Agent, or Firm—Melvin Sharp; Richard L. Donaldson; William E. Hiller

[57] ABSTRACT

Magnetic bubble domain memory circuit in which magnetizable overlay patterns of magnetically soft material, e.g. permalloy, are provided as bubble propagation elements on a bubble-supporting magnetic layer to define major and minor bubble propagation paths. The major bubble propagation paths provide interchangeable bubble input and output sections, and the minor bubble propagation paths are in the form of closed storage loops providing a bubble storage section comprising first and second pairs of blocks. Bubble generators are provided for each of the blocks included in the first and second pairs thereof comprising the bubble storage section, along with first and second detectors and input/output tracks of bubble propagation elements associated with the respective pairs of blocks of storage loops. Swap transfer/replicate gates are disposed between the input/output tracks and each of the storage loops included in the blocks of storage loops. These gates are alternately operable in a swap transfer mode and a replicate mode so as to simultaneously transfer data as represented by magnetic bubbles and voids from the tracks to the storage loops and from the storage loops to the tracks when operated in a swap transfer mode, and to split respective magnetic bubbles incident thereon in a replicate mode to form a duplicate magnetic bubble in addition to the original magnetic bubble so as to preserve the data intact in the minor storage loop while delivering a bubble to a detector for readout. The first and second bubble detectors are 180° out of phase with respect to each other and are operable during respective halfcycles of a bubble propagation cycle to sense the presence or absence of magnetic bubbles. Thus, respective data bits from different blocks are alternately sensed by the first and second bubble detectors in each bubble propagation cycle to provide a data readout rate twice the field rate.

14 Claims, 6 Drawing Figures

BLOCK REPLICATE MAGNETIC BUBBLE MEMORY CIRCUIT FOR HIGH SPEED DATA READOUT

This invention relates to magnetic bubble domain memory structures, and more particularly to a magnetic bubble domain memory circuit architecture of block replicate form and so configured as to enable a data readout rate equal to twice the field rate. In this connection, the particular embodiments of the magnetic bubble domain memory circuit described herein, and the double level swap transfer/replicate gate structure forming a component thereof constitute improvements of the subject matter disclosed and claimed in pending U.S. application, Ser. No. 783,996, filed Apr. 4, 1977, entitled "Magnetic Bubble Memory Circuit With Input Swap and Output Replicate Gates".

Typically, magnetic domain memories include one or more memory storage loops, accommodating a plurality of magnetic single-walled domains or bubbles, each of which represents one bit of binary information. These bubbles may be rotated about individual memory storage loops in a synchronized and controlled manner such that access to the stored information imparted thereby can be gained. The memory storage loops are usually organized as a plurality of minor storage loops associated with a major storage loop, wherein information in the form of a series of magnetic bubble domains and voids respectively representing binary "1's" and "0's" may be transferred between the major loop and each of the respective minor loops so as to enable information to be read from the memory and to be written into the memory as desired. The magnetic bubble domain memory chip comprises a substrate of non-magnetic material on which a planar film or layer of magnetic material capable of supporting magnetic bubble domains is disposed. The magnetic bubbles are caused to travel along predetermined paths within the layer of bubble-supporting magnetic material by laying down a magnetizable bubble propagation path pattern on the layer of magnetic material as a series of thin film propagation elements of magnetically soft material, e.g. permalloy, in the form of tiny geometric shapes or circuit elements. In this respect, a magnetic drive field within the plane of the layer of magnetic material is rotated which causes the individual propagation elements included in the bubble propagation path pattern to be sequentially polarized in a cyclical sequence causing the individual bubbles to be propagated in a step-wise movement along the path as defined by the magnetizable propagation elements. One such overlay pattern commonly enjoyed in a magnetic bubble domain memory chip is the so-called series of alternating T-shaped and bar-shaped permalloy elements. A chevron pattern of permalloy elements is another common configuration for this purpose. Magnetic bubble domain memories and the general types of bubble propagation paths employed therewith in the processing of data as represented by the presence and absence of magnetic bubble domains as hereinbefore described are disclosed in the article "Magnetic Bubbles" by Andrew H. Bobeck and H. E. D. Scovil, in *Scientific American* magazine, pages 78–90 (June 1971).

While these bubble propagation path patterns on a magnetic bubble domain memory chip have generally provided satisfactory operation, the small size of the magnetizable circuit elements as employed in the bubble propagation path pattern overlay as used for magnetic bubbles of five micron size or smaller and the precision with which these soft magnetic elements must be applied to the bubble-supporting magnetic layer present difficulties in maintaining the limited alignment tolerances required to produce a bubble propagation path pattern complete with bubble function-determining components, such as bubble generators, replicators, annihilators and transfer gates, for example, which operates in a fully reliable manner in propagating bubbles in guided paths about the bubble-supporting magnetic layer of the memory chip. In this connection, the movement of each of the bubbles on the memory chip as to direction and the action thereon by various bubble function-determining components must be precise and wholly predictable if the memory chip is to perform in a manner enabling data retrieval as represented by the presence or absence of magnetic bubbles when read from the memory chip output by suitable magnetic bubble detectors. Additionally, it is desirable to so construct the memory chip to enable non-destructive readout of data, thereby requiring a replicate function on the chip to replicate respective bubbles as these bubbles are being directed onto a readout path for subsequent sensing by a bubble detector and erasure by an annihilator. The replicate bubble is returned to the same virtual position in a bubble propagation path from which the bubble to be subsequently detected had departed to preserve the data intact on the memory chip. To this end, magnetic bubble domain memory chips commonly include a bubble replicate function therewith in the form of a particular bubble replicate member disposed in the bubble propagation path pattern at an appropriate location and operable to effectively split a bubble to be subsequently read out, thereby producing two bubbles with the second replicate bubble being returned to the same virtual position departed by the bubble to be readout. Bubble replicator structures heretofore known, in a like manner to the individual propagation elements of magnetically soft material included in the bubble propagation path pattern, have been subject to extremely narrow tolerance ranges in relation to control conductors to which the bubble replicators are responsive in order to properly perform the replicate function in duplicating a bubble to be read out by a bubble detector on the chip.

The earlier types of chip architectures employed in the formation of the major and minor bubble propagation paths of a magnetic bubble domain memory circuit impose certain restrictive limitations concerning data access time because of their configurations, thereby resulting in an overall rate of data processing at a level less than the field access rate.

Advances in the sophistication of a magnetic bubble domain memory circuit have included a so-called "block replicate" bubble propagation path architecture which is generally described in an article entitled "64K Fast Access Chip Design" by J. E. Ympa, I. S. Gergis and J. L. Archer appearing in *AIP Conference Proceedings No. 29 Magnetism and Magnetic Materials*, pp. 51–53 (1975). This type of magnetic bubble domain structure enables faster access to data, by permitting data readout at a rate equal to the field access rate. In the previously mentioned U.S. application, Ser. No. 783,996, filed Apr. 4, 1977, a block replicate bubble propagation path architecture is employed in conjunction with swap transfer gates and replicate gates facilitating data access at a readout rate equal to the field access rate. The swap transfer gate structure and replicate transfer output gate structure employed therein are of a generally similar character to the swap transfer gate and the replicate/transfer output gate disclosed in an article entitled "68 k Bit capacity 16 μm - Period Magnetic Bubble Memory Chip Design with 2 μm Minimum Features" by P. I. Bonyhard and J. L. Smith appearing in *IEEE Transactions on Magnetics*, Vol. MAG-12, No. 6, pp. 614–617 (Nov. 1976). The so-called swap transfer gate disclosed in the aforesaid article is not a true swap transfer gate, however, because the virtual positions of data bits being swapped between a major propagation path and a minor storage loop are not maintained. Thus, the structure is more properly termed a pseudo-swap transfer gate. The replicate/transfer output gate of the Bonyhard et al article is subject to a similar limitation in data processing which restricts its usefulness.

SUMMARY OF THE INVENTION

In accordance with the present invention, a magnetic bubble domain memory structure is provided employing a block replicate chip architecture of improved character, wherein a data readout rate at twice the field rate may be achieved. The magnetic bubble domain memory circuit as contemplated herein provides a bubble propagation path pattern of magnetically soft material disposed on a layer of bubble-supporting magnetic material which includes major propagation paths defining interchangeable bubble input and output sections, and minor bubble propagation paths defining a bubble storage section operably associated with the major bubble propagation paths. The bubble storage section includes first and second pairs of blocks each including a plurality of minor propagation paths arranged as storage loops. First and second pairs of bubble generators are provided, there being a bubble generator respectively operably associated with each block of storage loops for generating bubbles included in data chains represented by bubbles and voids. First and second detectors are provided, the detectors being respectively operably associated with the first and second pairs of blocks. The major bubble propagation paths include input/output tracks defined by a plurality of individual bubble propagation elements and corresponding to the bubble generators and to the first and second detectors. The input/output tracks are disposed along each of the blocks adjacent one end of the respective minor storage loops included in the blocks.

Swap transfer/replicate gates are interposed between the input/output tracks and the blocks of storage loops, there being one swap transfer/replicate gate for each storage loop. The gates are operable in a swap transfer mode and a replicate mode in response to respective energy pulses of predetermined differing magnitudes as delivered from a pulse generator regulated by an appropriate control circuit. In a swap transfer mode, the gates are enabled to simultaneously transfer data as represented by magnetic bubbles and voids from the tracks to the storage loops and from the storage loops to the tracks. In a replicate mode, the gates are enabled to split respective magnetic bubbles incident thereon from a storage loop so as to form a replicate magnetic bubble in addition to the original magnetic bubble for delivering one of the bubbles from the minor storage loop to a bubble detector for readout, while retaining the other bubble in its same virtual position in the storage loop of the block.

The first and second bubble detectors are so constructed as to be 180° out of phase with respect to each other, the detectors being operable to sense the presence or absence of magnetic bubbles during respective half-cycles of a bubble propagation cycle. Thus, data readout is possible at a rate equal to twice the field rate.

In this architecture, the length of the individual storage loops would typically be halved, but the number of loops would be doubled in comparison to the chip architecture disclosed in the aforesaid U.S. patent application Ser. No. 783,996, filed Apr. 4, 1977.

The gates, whether operable in a swap transfer or replicate mode, maintain the virtual positions of the data bits directed thereto. Thus, in a swap mode, for example, the gates are so configured as to be responsive to a pulsed energy signal from a pulse generator as regulated by an appropriate control circuit for introducing data as represented by chains of magnetic bubbles and voids from an input/output track to the storage loops included in a respective pair of blocks, while simultaneously accomplishing a reverse transfer of data from the respective storage loops to the input/output track in a smooth undisturbed data interchange, wherein the virtual positions of the respective magnetic bubbles included in a data chain of bubbles and voids either introduced into a storage loop or departing same are maintained intact.

More specifically, the present invention contemplates a magnetic bubble domain memory circuit having a chip architecture in which the first and second pairs of blocks of storage loops are disposed in juxtaposition with respect to each other, with the bubble generators, the input/output tracks, and the first and second detectors being located outwardly with respect to the first and second pairs of blocks on opposite sides thereof so as to provide one detector for each pair of blocks, and corresponding bubble generators and input/output tracks for each of the blocks.

In another embodiment of the magnetic bubble domain memory circuit contemplated herein, the chip architecture is configured with the first and second pairs of blocks of storage loops disposed in spaced apart relation. The bubble generators, the detectors, and the input/output tracks are located between the first and second pairs of blocks, with the detectors being interconnected by cross leads.

The swap transfer/replicate gate structure in accordance with the present invention is provided for each of the storage loops included in the respective first and second pairs of blocks and is of double level construction. In the latter connection, the magnetic bubble domain memory circuit itself comprises a multi-level structure including a non-magnetic substrate, a planar layer of bubble-supporting magnetic material disposed thereon, and a multi-level assembly including patterned first and second metallization levels separated by an intermediate insulation layer disposed on the planar layer of magnetic material. The first metallization level includes the control conductors for the bubble function-determining components and the propagation elements which constitute the permalloy overlay pattern forming the second metallization level. Each swap transfer/replicate gate includes an elongated asymmetric hairpin element having a hairpin loop defined at one end thereof, this hairpin element forming part of the first metallization level of control conductors and being mounted directly onto the planar layer of bubble-supporting magnetic material. The insulation layer is disposed atop the hairpin element included in each of the gates.

A second level of the gate structure is disposed at the same level as the permalloy elements defining the bubble propagation paths and includes a 90° hook-like transfer element disposed at one end of a corresponding storage loop so as to form a bight of the loop. The 90° hook-like element includes an intermediate leg portion thereof in registration with the hairpin element disposed therebeneath. The other leg portion of the hook-like element has a notch provided therein to form sections of differing width in that leg portion. Bubble steering spacer elements are also disposed in the second level of the gate structure, being generally of irregular crescent shape and providing respective guidance paths associated with the minor propagation path defining the storage loop and with the input/output track of a major propagation path. The input/output track includes an asymmetric bubble-control propagation element overlying one elongate leg of the hairpin element at the upstream side of bubble travel direction, this asymmetric bubble-control propagation element forming part of the input/output track and the gate structure and guiding magnetic bubbles directed thereto in one of two paths of direction depending upon whether the gate has been activated by a pulsed energy signal to operate in a swap mode. Operation of the pulse generator in a selected control mode to develop a pulsed energy signal of a predetermined magnitude directed to the hairpin element of the gate structure enables data as represented by chains of magnetic bubbles and voids to be simultaneously interchanged between the input/output track and a storage loop in a block of the bubble storage section. In this way, it is possible to introduce new data into the bubble storage section during a write mode while simultaneously withdrawing old data from the bubble storage section, thereby materially reducing the time required for the substitution of new data into the bubble storage section of the magnetic bubble domain memory chip.

The block replicate chip architectures for a magnetic bubble domain memory circuit as contemplated herein enable data readout to proceed at a rate twice that of the field rate at which data is introduced to the bubble storage section comprising first and second pairs of blocks of storage loops. Thus, the speed at which data may be accessed as compared to block replicate chip architectures heretofore known is effectively doubled through the use of the block replicate architectures disclosed herein.

Figure 1:
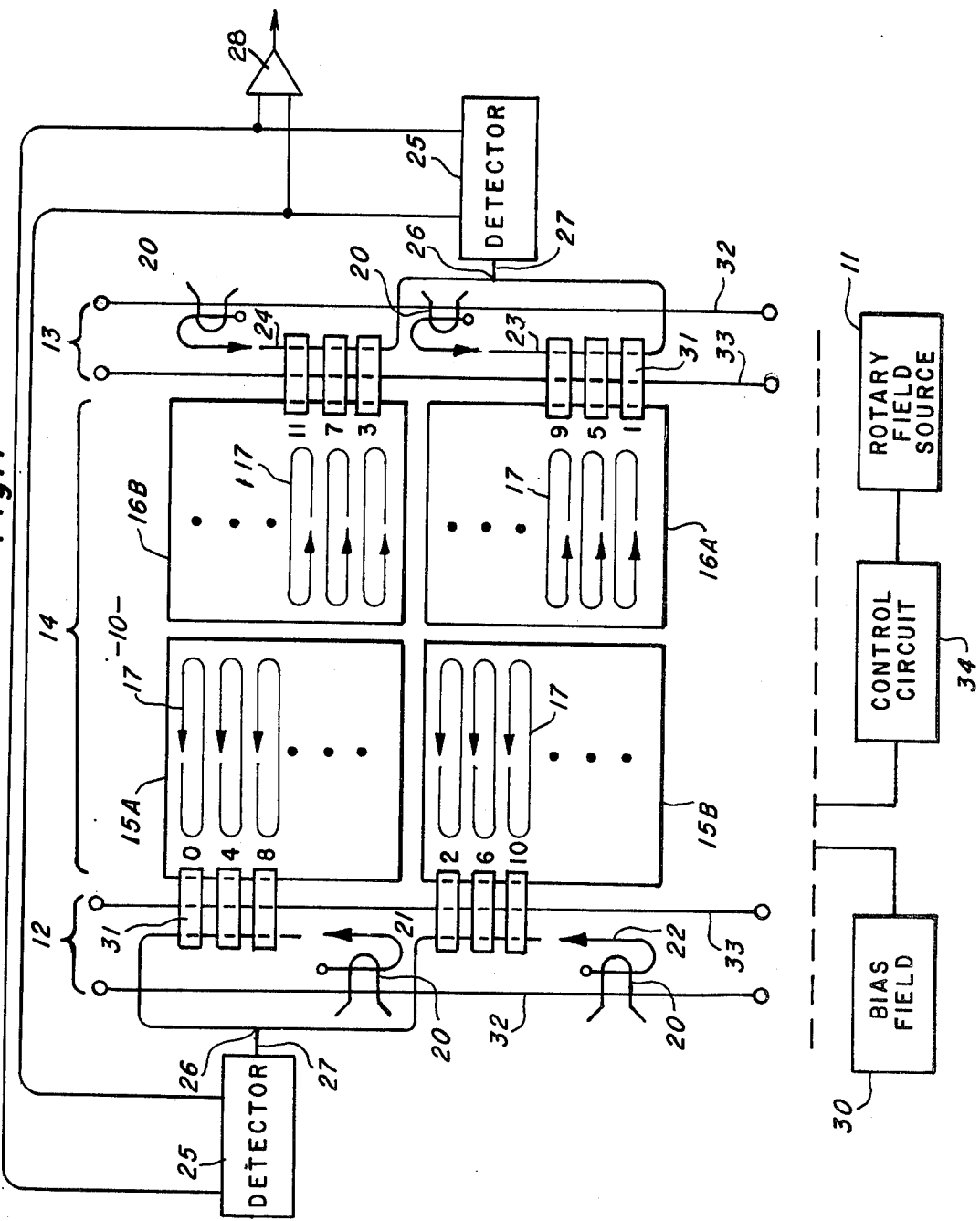
FIG. 1 is a diagramatic view of a magnetic bubble domain memory chip employing a block replicate architecture in accordance with the present invention.

Referring more specifically to the drawings, FIG. 1 schematically illustrates one embodiment of a block replicate magnetic bubble domain chip architecture in accordance with the present invention. It will be understood that the magnetic bubble domain memory chip as described herein in connection with the embodiment of FIG. 1 and the embodiment of FIG. 2 as well comprises a non-magnetic substrate portion having a planar bubble-supporting magnetic film or layer possessing a uniaxial anisotropy, the bubble-supporting planar magnetic layer being generally designated at 10 in FIG. 1. Typically, the non-magnetic substrate is a non-magnetic rare earth garnet, gadolinium gallium garnet (GGG) for example, and the film or layer 10 is an epitaxially deposited garnet layer, e.g. $(YSmCaLu)_3 (FeGe)_5 O_{12}$ of the order of about 2 microns in thickness for use with magnetic bubbles of 2 microns in diameter and having an easy magnetization in a direction perpendicular to the plane of the layer. Other materials suitable as the epitaxially grown layer of bubble-supporting magnetic material and which may have a thickness range of the order of 1–10 microns include: $(YSm)_3 (FeGa)_5 O_{12}$, $(YGdTm)_3 (FeGa)_5 O_{12}$, $(YEuYb)_3 (FeAl)_5 O_{12}$, $(YGdYb)_3 (FeGa)_5 O_{12}$, $(YEu)_3 Fe_5 O_{12}$, $(LuSm)_3 Fe_5 O_{12}$, $(YGd)_3 Fe_5 O_{12}$ and $(YSmCa)_3 (FeGe)_5 O_{12}$.

In FIG. 1, a bubble propagation path pattern is disposed on the layer of magnetic material 10 for guiding the movement of the bubbles in the layer 10 in response to a change in orientation of a rotary magnetic field within the plane of the layer 10, the rotary in-plane magnetic field being provided from a rotary field source 11. The bubble propagation path pattern may comprise an overlay pattern of magnetically soft material, e.g. permalloy, disposed on a major surface of the planar magnetic layer 10. In the latter connection, it will be understood that a multi-level assembly is formed on the planar magnetic layer 10 including patterned first and second metallization layers and a layer of insulating material, such as silicon dioxide, interposed therebetween. The first metallization layer is patterned to define control conductors and component parts of bubble function-affecting structures as hereinafter described. The patterned second metallization layer comprises the overlay pattern of magnetically soft material. As shown in FIG. 1, this overlay pattern of magnetically soft material is generally arranged to include major bubble propagation paths 12 and 13 between which an intermediate bubble storage section 14 of minor bubble propagation paths is disposed. The major bubble propagation paths 12 and 13 define interchangeable bubble input and output sections as will be hereinafter described. The intermediate bubble storage section 14 is arranged in a block configuration, including first and second pairs of blocks 15A, 15B and 16A, 16B each including a plurality of minor propagation paths in the form of individual closed bubble storage loops 17.

The major bubble propagation path 12 is associated with the first pair of blocks 15A, 15B of storage loops 17, and the major bubble propagation path 13 is associated with the second pair of blocks 16A, 16B of storage loops 17. Bubble generator means for the magnetic bubble domain memory chip of FIG. 1 is provided in the form of first and second pairs of bubble generators 20 respectively operably associated with each block such that one bubble generator 20 is provided for each of the blocks 15A, 15B, 16A and 16B of storage loops 17. Each bubble generator 20 may be of a suitable form, such as a hairpin structure, to produce bubbles at each complete rotation of the in-plane magnetic drive field derived from the field source 11 for respective propagation along the major propagation paths 12 and 13. To this end, the major bubble propagation path 12 includes respective input/output tracks 21, 22 defined by pluralities of individual bubble propagation elements of magnetically soft material. The input/output tracks 21, 22 respectively correspond to the blocks 15A and 15B of storage loops 17. Each input/output track 21, 22 has its own bubble generator 20 such that bubbles produced therefrom upon a complete rotation of the in-plane magnetic drive field may be propagated along the input/output tracks 21, 22 for introduction into the storage loops 17 of the blocks 15A, 15B in a manner to be hereinafter described.

In like manner, the major bubble propagation path 13 includes input/output tracks 23, 24 respectively corresponding to the blocks 16A and 16B of storage loops 17. Each of the intput/output tracks 23, 24 of the major bubble propagation path 13 is provided with its own bubble generator 20. Bubbles produced from the respective bubble generators 20, 20 associated with the input/output tracks 23, 24 may be propagated therealong for introduction into the storage loops 17 of the blocks 16A, 16B.

The input/output tracks 21 and 23 respectively corresponding to the blocks 15A and 16A in the bubble storage section 14 are each constructed in a generally U-shaped configuration, wherein the inner leg thereof is in proximity to the corresponding block of storage loops 17 and the outer leg thereof is directed to a corresponding one of first and second bubble detectors 25, 25. The input/output tracks 22 and 24 respectively corresponding to the blocks 15B and 16B of storage loops 17 are similarly configured so as to include a portion thereof extending alongside the corresponding one of the blocks 15B and 16B, an offset parallel portion directed toward a detector 25, and a connecting intermediate portion disposed in substantially perpendicular relationship to the offset parallel portions in defining the respective input/output tracks 22 and 24. The input/output tracks 21, 22 and 23, 24 on opposite sides of the bubble storage section 14 intersect in the vicinity of the detector 25 corresponding thereto at a merge junction point 26. Each of the merge junction points 26, 26 is connected to the corresponding detector 25, 25 by a continuation of the respective major propagation path 12 or 13 extending from the merge junction point 26 to the detector 25. The continuation portion of the major propagation path 12 or 13 defines a detector feed track 27 which delivers data in the form of respective chains of magnetic bubbles and voids representing binary 1's and 0's to the respective detector 25 for readout. It will be understood that the individual magnetic domains have a diameter as determined by a mangnetic bias field supplied by a source 30 and applied substantially perpendicularly to the chip. Bubble diameters as small as 1-5 microns may be employed in the operation of the embodiments of the magnetic bubble domain memory chip herein disclosed.

Swap transfer/replicate gate means are interposed between each of the input/output tracks 21, 22, 23 and 24 and the blocks 15A, 15B, 16A and 16B of storage loops 17, there being an individual swap transfer/replicate gate 31 corresponding to each of the storage loops 17 included in the blocks of the bubble storage section 14. In accordance with the present invention, the respective swap transfer/replicate gates 31 are of identical structure, being operable in a swap transfer mode and a replicate mode in response to respective energy pulses of predetermined differing magnitudes. To this end, it will be understood that the chip is provided with respective control conductors included in the first metallization layer of the multi-level assembly formed on the planar magnetic layer 10 of the chip. Thus, a first pair of elongated control conductors 32, 32 are provided on opposite sides of the bubble storage section 14 so as to underlie the respective bubble generators 20 for controlled activation thereof. Similarly, a second pair of elongated conductors 33 are provided on opposite sides of the bubble storage section 14 to provide a control line for activating the respective gates 31 in either a swap transfer or a replicate mode depending upon the magnitude of the energy pulse imparted to a control line 33. It will be understood that a control circuit 34 including a variable pulse generator is provided for pulsing either control line 33 in a predetermined manner so as to enable the gates 31 to operate in a swap transfer mode or a replicate mode as desired.

When a gate 31 is activated in its swap transfer mode, data as represented by chains of magnetic bubbles and voids may be simultaneously transferred between a respective input/output track and the storage loops 17 included in a block corresponding to the input/output track. Thus, for example, a bubble may be transferred from the input/output track 21 to a particular storage loop 17 included in the block 15A via the gate 31 corresponding thereto and vice versa, thereby enabling bubbles to travel simultaneously in either direction between the input/output track 21 and each of the respective storage loops 17 included in the block 15A upon proper activation of the respective gates 31 associated with each of the storage loops 17 in the block 15A. In this way, it is possible to introduce new data into the storage loops 17 of the respective blocks 15A, 15B, 16A and 16B of the bubble storage section 14 during a write mode while simultaneously withdrawing old data from the storage loops 17, thereby materially reducing the time required for the substitution of new data into the bubble storage section 14 of the magnetic bubble domain memory chip 10. In this connection, the old data as represented by chains of magnetic bubbles and voids, after being transferred from the storage loops 17 via the respective gates 31, is propagated along the corresponding input/output track leading to the merge junction point 26 and along the feed track 27 to the corresponding one of the detectors 25, 25 where the old data is annihilated or erased in a non-detect cycle of the detector 25.

The activation of a gate 31 in its replicate mode causes a bubble in the storage loop 17 incident thereon to be split, thereby producing two bubbles wherein one of the two bubbles is returned to the same virtual position in the storage loop 17 and the other bubble is directed onto one of the input/output tracks 21, 22, 23 and 24 for eventual readout by the corresponding detector 25. Thus, the use of the replicate function in activating the gates 31 for data readout preserves the data intact on the memory chip by returning respective magnetic bubbles to the storage loops while providing a second bubble to enable data readout by the corresponding detector 25.

In accordance with the present invention, the first and second bubble detectors 25, 25 are of unipolar design, each detector being rotated by 180° with respect to the other. The first and second detectors 25, 25 are thereby operable to sense the presence or absence of magnetic bubbles during respective half-cycles of a bubble propagation cycle. Additionally, the blocks 15A and 15B of storage loops 17 are rotated 180° relative to the blocks 16A, 16B of storage loops 17 so as to be 180° out of phase therewith. Thus, it will be understood that data is respectively delivered to the first and second detectors 25, 25 for readout phased by 180° in time. Since the unipolar detector signal is one-half cycle in duration, one data bit (either a bubble or a void) from the blocks 15A, 15B of storage loops 17 and one data bit from the blocks 16A, 16B will be respectively detected by the corresponding detector 25 in one cycle, each spaced by one-half cycle. The detectors 25, 25 may be connected to the same sense amplifier 28 which may be of a suitable conventional construction. It will be understood, therefore, that the total rate at which data may be read out of the magnetic bubble domain memory chip architecture of FIG. 1 is twice the field rate at which data may be introduced into the storage loops 17 of the respective blocks 15A, 15B, 16A and 16B of the bubble storage section 14.

By employing the first and second pairs of blocks 15A, 15B and 16A, 16B in the bubble storage section 14, the lengths of the individual storage loops 17 may typically be one-half of the lengths of the storage loops in a block replicate chip architecture of the type disclosed in pending U.s. patent application Ser. No. 783,996, filed Apr. 4, 1977. However, the total number of the storage loops 17 is doubled, thereby providing 2 M loops with N/2 bits/loop. It will be seen that the data page which comprises the same virtual position for each of the storage loops 17 included in the bubble storage section 14 is twice as long as the data page for the block replicate chip architecture described in the aforesaid pending U.S. application Ser. No. 783,996, filed Apr. 4, 1977. Thus, there are N/2 pages with 2 M bits provided by the block replicate chip architecture of FIG. 1 according to this invention. Such a construction reduces the access time to the first data bit by shortening the individual storage loops 17, and reduces by one-half, the time required to read the data contents of the entire chip.

Figure 2:
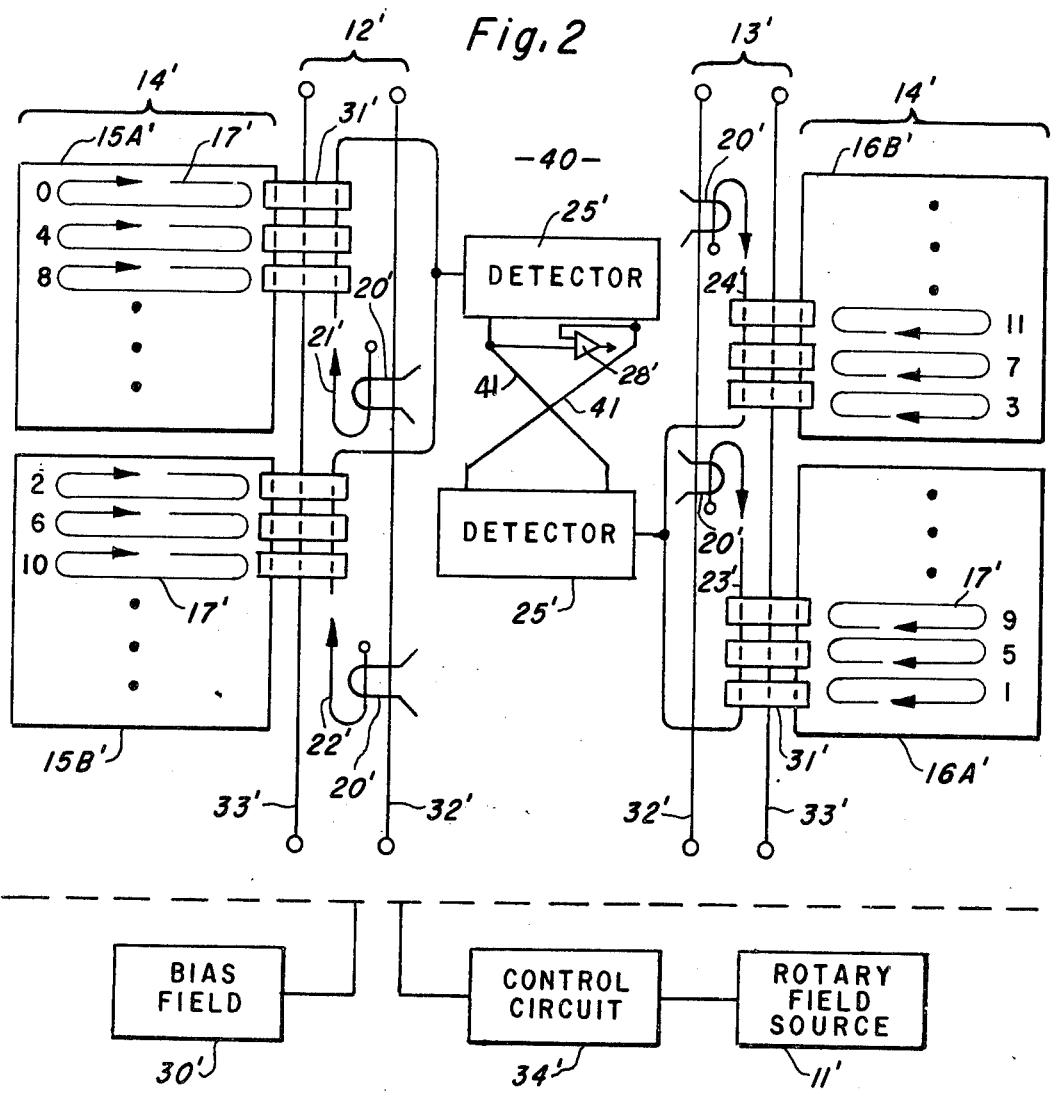
FIG. 2 is a diagramatic view of a magnetic bubble domain memory chip employing another embodiment of a block replicate architecture in accordance with the present invention.
Figure 3:
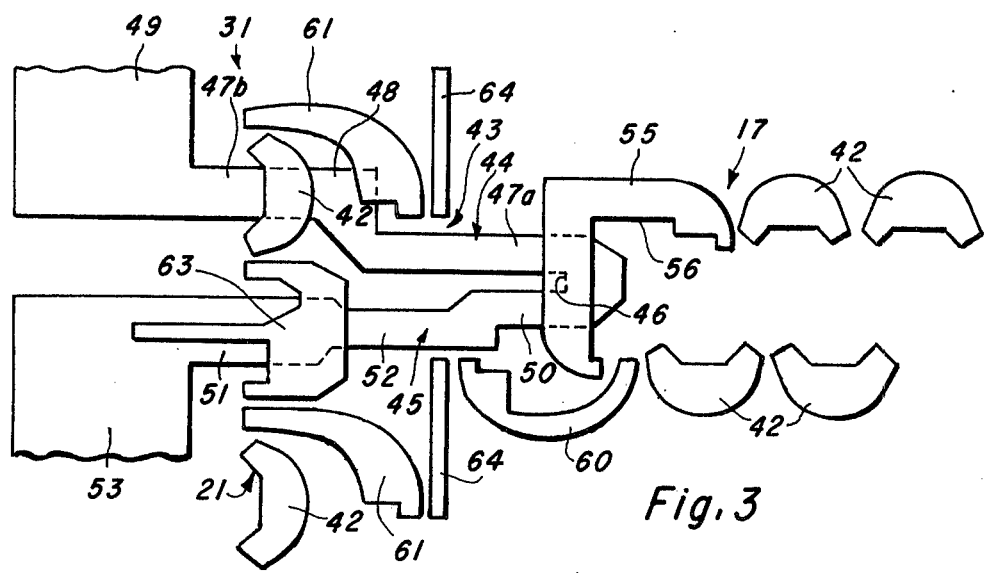
FIG. 3 is an enlarged, partially schematic, plan view of a portion of the magnetic bubble propagation path pattern employable in the magnetic bubble domain memory chip of FIGS. 1 or 2, and illustrating a swap transfer/replicate gate as located in a major bubble propagation path and at the end of a data storage loop.

Referring now to FIG. 2, another embodiment of a block replicate magnetic bubble domain chip architecture in accordance with the present invention is illustrated. It will be understood that a bubble propagation path pattern is disposed on the layer of magnetic material 40 in the embodiment of FIG. 2 of the same general character as that described in connection with the embodiment of FIG. 2. To this end, the same reference numerals with the prime notation added have been applied to elements of the chip architecture of FIG. 2 having a corresponding counterpart in FIG. 1 to avoid repetitious description. In the chip architecture of FIG. 2, the first and second pairs of blocks 15A', 15B' and 16A', 16B' comprising the bubble storage section 14' are spaced apart so as to dispose respective portions of the bubble storage section 14' of minor bubble propagation paths on opposite sides of the major bubble propagation paths 12' and 13' which define interchangeable bubble input and output sections in the same manner as the embodiment of FIG. 1. Thus, the first and second pairs of bubble generators 20' operably associated with each block are disposed between the first and second pairs of blocks 15A', 15B' and 16A', 16B', as are the first and second detectors 25', 25' and the respective input/output tracks 21', 22', 23' and 24'. The first and second detectors 25', 25' are interconnected by lead crossovers 41, 41 of electrically conductive material, such as chrome-gold patterned crossover lead configuration, for example, and are connected to the same sense amplifier 28'. The embodiment of FIG. 2 by locating the first and second detectors 25', 25' in adjacent proximity to each other effects a space saving, with the detectors 25', 25' being located in the approximate center of the magnetic bubble domain memory chip. This detector arrangement further enables a reduction in the requirements for the strength of the in-plane rotary magnetic field and in the power of the orthogonally would pair of driving coils. The detectors 25', 25' are of unipolar type, and the same phase difference of 180° exists therebetween and between the first and second pairs of blocks 15A', 15B' and 16A', 16B' as in the embodiment of FIG. 1. Furthermore, placement of the detectors 25', 25' in the central region of the chip in the embodiment of FIG. 2 is responsible for greater stretching power imparted to the bubbles as they are delivered to the detectors 25', 25' so as to facilitate bubble sensing. As described in connection with the operation of the embodiment of FIG. 1, the embodiment of FIG. 2 also affords a data readout rate twice the field rate, thereby substantially increasing the speed at which data may be read out of the magnetic bubble domain memory chip configured in the manner of FIG. 2 as compared to the data readout rate of magnetic bubble domain memory chips of conventional block replicate architecture.

In accordance with the present invention, the individual swap transfer/replicate gates 31 and 31' in the block replicate chip architectures of FIGS. 1 and 2 are of identical structure and correspond in number to the storage loops included in the blocks of the bubble storage section 14 or 14'. Referring now to FIGS. 3-6, one of these swap transfer/replicate gates 31 is illustrated in conjunction with a storage loop 17 and an input/output track, e.g. input/output track 21. Thus, the gate 31 is operably interconnected with the minor loop 17 and with the input/output track 21 by virtue of the control line 33 leading to the pulse generator included in the control circuit 34. For purposes of illustration, the individual courses of the closed storage loop 17 have been reduced in size so as to show only a pair of bubble propagation elements 42, 42 of soft magnetizable material (e.g. permalloy) in each of the courses as associated with the gate 31. It will be understood that a substantial number of bubble propagation elements 42 are provided in defining the respective courses of the closed storage loop 17. The gate 31 comprises a double level structure including a first metallization layer in the form of a substantially U-shaped hairpin element 43. The hairpin element 43 includes a pair of elongated asymmetrical legs 44, 45 joined at one end to define a hairpin loop 46.

The elongated legs 44, 45 have respective portions of varying width and in opposite relation to each other. To this end, the leg 44 includes two offset end portions 47a, 47b and an intermediate portion 48 of increased width, the intermediate portion 48 presenting an inclined beveled internal edge facing the leg 45. The intermediate portion 48 integrally interconnects the end portions 47a, 47b of the leg 44. The end portion 47b of the leg 44 is of greater width than the end portion 47a and terminates in an enlarged pad 49 at the opposite end of the leg 44 from the hairpin loop 46. The elongated leg 45 includes two offset end portions 50, 51, and an intermediate portion 52 integrally interconnecting the end portions 50, 51. The end portion 50 of the leg 45 is joined to the end portion 47a of the leg 44 in defining the hairpin loop 46. The opposite end portion 51 of the leg 45 is of greater width than the end portion 50 and terminates in an enlarged pad 53. At the offset juncture between the intermediate portion 52 and the end portion 50 of the leg 45, an internal slanted edge facing the opposite leg 44 is defined.

It will be understood that a patterned insulation layer (not shown) as previously described overlies the substantially U-shaped hairpin element 43 of the gate 31, and a second metallization layer is formed thereon to include the other elements of the gate 31 at the second level thereof which is at the same level as the individual bubble propagation elements 42 defining the storage loop 17 in the bubble storage section 14. Although the individual bubble propagation elements 42 are illustrated in the form of an arcuate partial disc pick-ax configuration of the type disclosed and claimed in pending U.S. patent application Ser. No. 695,483, filed June 14, 1976, now abandoned, it will be understood that the particular bubble propagation elements 42 are for illustrative purposes only and that any other suitable bubble propagation path element may be employed, such as the typical path sequence of alternating T and bar elements, for example.

The gate 31 includes at the second level thereof a 90° hook-like transfer element 55 which is disposed at one end of the minor bubble propagation path so as to form a bight of the storage loop 17 defined thereby. The opposite ends of the hook-like transfer element 55 are located in the opposite courses of the loop 17, while an intermediate leg portion of the hook-like element 55 extends across the hairpin element 43 with the insulating layer sandwiched therebetween. The intermediate leg portion of the hook-like element 55 is thereby located in overlapping relation to the hairpin loop region 46 of the hairpin element 43. The other leg of the hook-like element 55 extends along one course of the storage loop 17 and has an inwardly-facing notch 56 defined therein to provide a leg portion section of reduced width adjacent to the perpendicularly-related leg portion which overlaps the hairpin loop region 46. The presence of the notch 56 improves the reliability of the magnetic poles developed in the adjacent areas of the hook-like element 55 in response to re-orientation of the rotary in-plane magnetic drive field in determining the propagation movement of the magnetic bubbles.

The second level of the gate 31 further includes first and second spacer elements 60 and 61 in the form of substantially crescent-shaped bubble steering elements of asymmetric configuration. To this end, the first spacer element 60 is associated with the storage loop 17, being arranged on one side of the hairpin element 43 so as to include one end portion thereof interposed between a corresponding end of the hook-like element 55 and a propagation element 42 of the storage loop 17. The opposite end of the first spacer element 60 is disposed in proximity to the intermediate portion 52 of the elongate leg 45 of the hairpin element 43, thereby being spaced from the hairpin loop region 46. The substantially crescent-shaped bubble steering element comprising the first spacer element 60 includes an offset portion of increased width adjacent the end thereof in proximity to the intermediate portion 52 of the leg 45 of the hairpin element 43.

A pair of second spacer elements 61, 61 are provided in association with the track 21 which extends in orthogonal relationship to the storage loop 17 and transversely across the legs 44, 45 of the hairpin element 43. In this respect, one of the second spacer elements 61 is associated with the track 21 on one side of the hairpin element 43, and the other of the second spacer elements 61 is associated with the track 21 on the opposite side of the hairpin element 43. Each of the respective second spacer elements 61, 61 includes one end portion thereof interposed between individual bubble propagation elements included in the track 21. The major bubble propagation path comprising the track 21 includes a transition bubble-steering propagation element 63 of asymmetric configuration, the bubble-steering propagation element 63 being located in overlying relation to the end portion 51 of the leg 45 of the hairpin element 43 and including a tail extending in overlying relation above the end portion 51 of the leg 45 and into the enlarged pad 53. The head of the asymmetric bubble-steering propagation element 63 is generally similar in configuration to the half-disc pick-ax bubble propagation elements 42, but has straight-sided edges which may be generally described as defining an asymmetrical trapezoidal body provided with depending legs at the opposite ends thereof and disposed on opposite sides of the end portion 51 of the leg 45 of the hairpin element 43. On the upstream side of the major propagation path comprising the track 21 in relation to the hairpin element 43, the end portion of the second spacer element 61 is interposed between a bubble propagation element 42 and the transition asymmetric bubble-steering propagation element 63. On the downstream side of the hairpin element 43, a bubble propagation element 42 is disposed in overlapping straddling relation to the end portion 47b of the leg 44 of the hairpin element 43. This latter bubble propagation element 42 is disposed between the asymmetric transition bubble-steering propagation element 63 and the end portion of the respective second spacer element 61. The substantially crescent-shaped bubble steering elements comprising the second spacer elements 61, 61 are respectively provided with regions of increasing width adjacent the opposite ends thereof and extending generally in the direction of the major propagation path comprising the track 21.

A pair of pick-off bars 64, 64 are included in the second level, being disposed on opposite sides of the hairpin element 43 so as to be located substantially perpendicular to the elongated legs 44, 45 of the hairpin element 43. The pick-off bar 64 located on the upstream side of the hairpin element 43 with respect to the direction of bubble movement through the major propagation path comprising the track 21 is disposed between the first spacer element 60 and the second spacer element 61 associated therewith. In this connection, one end of the pick-off bar 64 lies adjacent to one end portion of the first spacer element 60, while the opposite end of the pick-off bar 64 lies adjacent to the end portion of the second spacer element 61 remote from that end portion interposed between individual bubble propagation elements included in the major bubble propagation path comprising the track 21. The other pick-off bar 64 is located on the downstream side of the hairpin element 43 and has one end portion disposed adjacent to the end portion of the other second spacer element 61 remote from the track 21. It will be understood that the pick-off bars 64, 64 may be eliminated from the gate 31 in a given instance, provided that the permissive tolerance range in the spatial relationship between the first and second spacer elements 60 and 61, 61 is of more restrictive scope in order to provide proper swap operation of incoming and outgoing data with respect to the storage loop 17 and proper replicate operation depending upon the magnitude of the energy pulse provided on the control conductor 33 to activate the gate 31.

Figure 4:
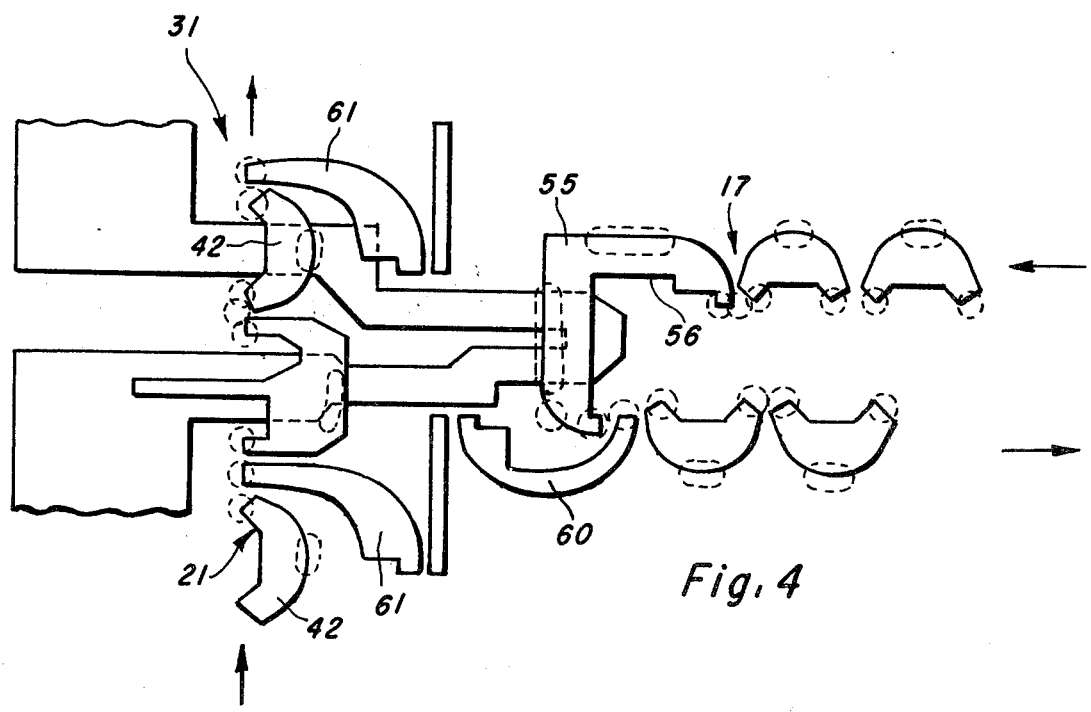
FIG. 4 is an enlarged, partially schematic, plan view similar to FIG. 3, but showing the normal propagation movement of respective magnetic bubbles in relation to the swap transfer/replicate gate when the gate is not actuated.
Figure 5:
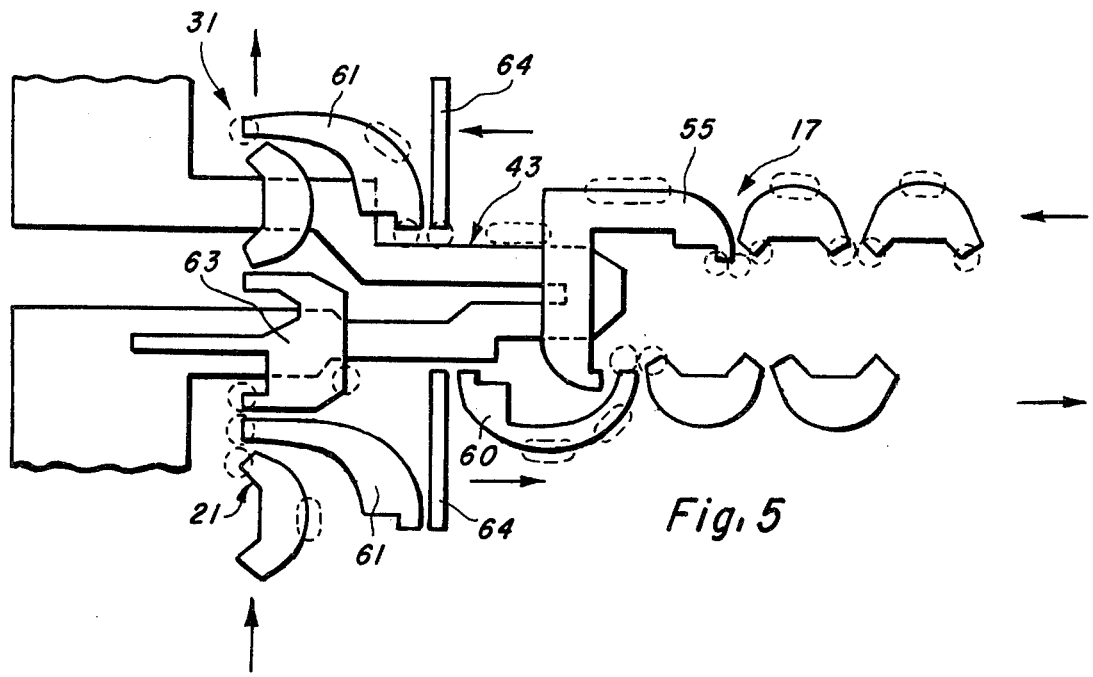
FIG. 5 is an enlarged, partially schematic, plan view similar to FIG. 2, but showing the propagation movement of respective magnetic bubbles when the swap transfer/replicate gate is actuated in a swap mode enabling simultaneous data transfer between a major propagation path and a minor storage loop.
Figure 6:
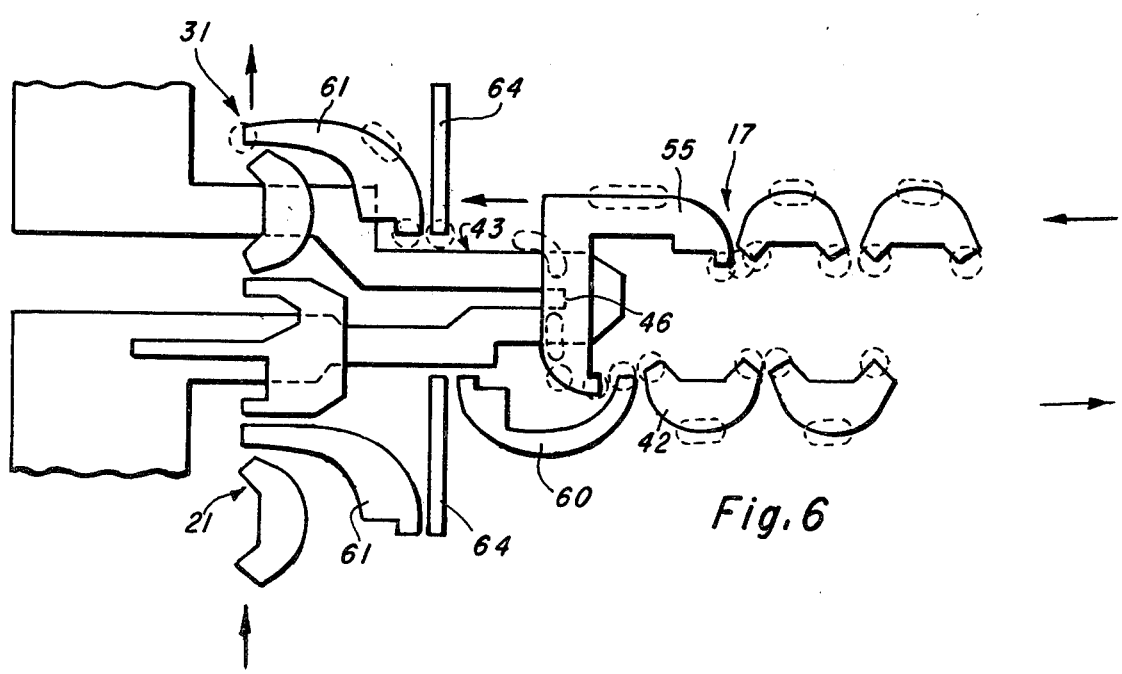
FIG. 6 is an enlarged, partially schematic, plan view similar to FIG. 2, but showing the propagation movement of a magnetic bubble when the swap transfer/replicate gate is actuated in a replicate mode wherein the bubble is split to form a second replicate bubble.

Referring to FIGS. 4, 5 and 6, the same illustration of the swap transfer/replicate output gate 31 as interposed between the storage loop 17 and the major propagation path comprising the track 21 is shown, wherein separate paths of bubble propagation movement are depicted in dashed lines to indicate normal bubble propagation movement when the gate 31 is not actuated (FIG. 4); propagation movement of the bubbles when the gate 31 is actuated in a swap mode (FIG. 5); and propagation movement of the bubbles when the gate 31 is actuated in a replicate mode (FIG. 6). Thus, FIG. 4 schematically illustrates the propagation of two respective magnetic bubbles, shown in dashed lines, as each bubble travels responsive to the re-orientation of the rotary in-plane magnetic field as derived from the source 11. The first of these bubbles is shown as being propagated along the track 21 in the direction indicated by the arrows. The second bubble is located in the storage loop 17 and is shown in its path of travel in completing one circuit of the closed loop, traveling in the direction of the arrows. It will be noted that the notch 56 in the L-shaped hook-like element 55 contributes to a stable location of a magnetic bubble along the perimeter of the leg portion of reduced width as defined thereby. In like manner, the regions of increased width on the first and second spacer elements 60 and 61, 61 respectively contribute to the location of a magnetic bubble on a portion of the hook-like element 55 of the gate 31 and the location of a bubble at an intermediate position of the individual bubble propagation elements 42 disposed in proximity to the respective bubble steering elements 61, 61.

FIG. 5 schematically illustrates the propagation of two respective magnetic bubbles, shown in dashed lines, during a swap operation in which the gate 31 is activated by a pulse of energy of a predetermined magnitude delivered to the hairpin element 43 of the gate 31. In this sense, it will be observed that a single magnetic bubble traveling along the major propagation path comprising the track 21 in the direction of the arrows is diverted by the energy pulse so as to be retained on the asymmetric bubble-steering element 63 from where the bubble is picked off by the pick-off bar 64 disposed on the upstream side of the hairpin element 43. Thereafter, this bubble is directed along the bubble steering element 60 onto one course of the storage loop 17. Simultaneously, a bubble traveling along the other course of the storage loop 17 and directed toward the bight of the loop 17 formed by the hook-like transfer element 55 is guided by the hook-like transfer element 55 out of the storage loop 17, being stretched along the outer edge of the hook-like transfer element 55 and thereafter attracted by the other pick-off bar 64. The bubble is then subsequently directed along the bubble steering element 61 comprising the second spacer element on the downstream side of the hairpin element 43 onto the major propagation path comprising the track 21 where it continues in its travel in the direction of the arrows associated with the track 12.

FIG. 6 schematically illustrates the propagation of a single magnetic bubble, shown in dashed lines, as it travels through the gate 31 during a replicate operation in which the gate 31 is activated by a pulse of energy of a predetermined magnitude different from that employed in a swap mode, as delivered to the hairpin element 43 of the gate 31. The bubble approaches the gate 31 along the upper course of the closed storage loop 17, being stretched along the outer edges of the hook-like transfer element 55. The bubble is then stretched along the leg portion of the hook-like element 55 which straddles the underlying hairpin loop region 46 of the hairpin element 43. At this point, the occurrence of a current pulse of the proper magnitude as received by the hairpin element 43 of the gate 31 splits the bubble, thereby forming a duplicate or replicate bubble. The now two bubbles repulse each other such that the lead bubble continues propagation in the closed storage loop 17 by being directed along the remaining leg portion of the hook-like transfer element 55, onto the end portion of the bubble steering element 60 and thence to the adjacent end portion of the bubble propagation element 42. The other bubble is attracted by the end of the pick-off bar 64 from where the bubble continues in its movement onto a bubble steering element 61 comprising the second spacer element on the downstream side of the hairpin element 43. The bubble subsequently moves onto the major propagation path comprising the track 21 from where it continues travel in the direction of the arrows associated with the track 21 for eventual delivery to a detector 25 for readout. Thus, the gate 31 when activated in its replicate mode, preserves the data intact while enabling readout by causing a bubble incident thereon to be split into two bubbles, one of which is retained in the storage loop 17 in the same virtual position occupied prior to the bubble-splitting event and the other bubble being directed onto the track 21 for eventual delivery to the detector 25 connected thereto for readout.

Although the invention has been described with respect to specific preferred embodiments thereof, it will be understood that variations and modifications can be made within the scope of the invention by those skilled in the art. Therefore, it is intended that the appended claims be interpreted as broadly as reasonably permitted by the prior art to include all such variations and modifications within the scope of the present invention.

We claim:

1. A magnetic bubble domain memory structure comprising:
    a planar layer of magnetic material in which magnetic bubbles can be moved,
    an overlay pattern of magnetically soft material disposed on a major surface of said planar magnetic layer and defining major and minor bubble propagation paths of individual bubble propagation elements for guiding the movement of said bubbles in said layer in response to a change in orientation of a rotary magnetic field within the plane of said layer, said major bubble propagation paths defining interchangeable bubble input and output sections, and said minor bubble propagation paths defining a bubble storage section operably associated with said major bubble propagation paths, said bubble storage section comprising at least a pair of blocks each including a plurality of minor propagation paths, generator means including at least a pair of bubble generators respectively operably associated with a corresponding one of said blocks for generating bubbles included in data chains represented by bubbles and voids, detector means including first and second detectors operably associated with said blocks, said major bubble propagation paths including input/output tracks corresponding to said bubble generators and to said first and second detectors, said tracks being disposed along each of said blocks adjacent one end of the respective minor storage paths included in said blocks, swap transfer/replicate gate means interposed between said tracks and said blocks of storage paths, said swap transfer/replicate gate means being operable in a swap transfer mode and a replicate mode in response to respective energy pulses of predetermined differing magnitudes, said swap transfer/replicate gate means being operable in its swap transfer mode to simultaneously transfer data as represented by magnetic bubbles and voids from said tracks to said storage paths and from said storage paths to said tracks, and said swap transfer/replicate gate means being operable in its replicate mode to split respective magnetic bubbles incident thereon from a minor storage path so as to form a replicate magnetic bubble in addition to the original magnetic bubble for transferring one of the two bubbles from the said minor storage path of said block to said track for delivery to one of said first and second detectors for readout while retaining the other bubble in its same virtual position in the said minor storage path of said block, pulse generator means operably associated with said bubble generators and said swap transfer/replicate gate means for directing energy pulses thereto of predetermined variable magnitudes, and said first and second bubble detectors being 180° out of phase with respect to each other and being operable to sense the presence or absence of magnetic bubbles during respective half-cycles of a bubble propagation cycle, whereby respective data bits from different blocks are alternately sensed by the first and second bubble detectors in each bubble propagation cycle to provide a data readout rate twice the field rate.

2. A magnetic bubble domain memory structure as set forth in claim 1, wherein said bubble storage section comprises first and second pairs of blocks each including a plurality of minor propagation paths, said first pair of blocks being 180° out of phase with respect to said second pair of blocks, said generator means comprises first and second pairs of bubble generators respectively operably associated with each block of a corresponding pair of said blocks for generating bubbles included in data chains represented by bubbles and voids, and said first and second detectors being respectively operably associated with said first and second pairs of blocks.

3. A magnetic bubble domain memory structure as set forth in claim 2, wherein said first and second pairs of blocks including respective pluralities of minor propagation paths are disposed in juxtaposition with respect to each other, first and second elongated bubble transfer conductors respectively disposed on the opposite sides of said bubble storage section in operable association with said first and second pairs of block respectively, said input/output tracks including first and second pairs of input/output tracks respectively disposed outwardly with respect to said first and second elongated bubble transfer conductors, a bubble generator operably associated with each of said input/output tracks including in said first and second pairs of input/output tracks, and said first and second detectors being respectively connected to said first and second pairs of input/output tracks.

4. A magnetic bubble domain memory structure as set forth in claim 3, wherein said swap transfer/replicate gate means comprises a plurality of swap transfer/replicate gates corresponding to each of said minor propagation paths included in said first and second pairs of blocks, and said swap transfer/replicate gates straddling said first and second elongated bubble transfer conductors and being operably connected at their opposite ends with the corresponding one of said input/output tracks and said minor propagation path.

5. A magnetic bubble domain memory structure as set forth in claim 2, wherein each of said plurality of minor propagation paths included in said bubble storage section comprises an endless loop.

6. A magnetic bubble domain memory structure as set forth in claim 5, wherein said swap transfer/replicate gate means comprises a plurality of swap transfer/replicate gates corresponding in number to the plurality of minor propagation paths included in said bubble storage section and being respectively operably associated therewith, and said swap transfer/replicate gates being of identical structure.

7. A magnetic bubble domain memory structure as set forth in claim 6, wherein each of said swap transfer/replicate gates is a double level gate interposed between a minor propagation path and an input/output track and including elements of magnetically soft material respectively correlated into each of said minor propagation path and said input/output track, said gate when in its swap transfer mode being operable to interchange data as represented by chains of magnetic bubbles and voids from the corresponding one of said tracks to said minor propagation path associated therewith and simultaneously from said minor propagation path to said track while retaining the interchanged data in the same virtual bit positions occupied by the respective data bits in the track and the minor propagation path prior to the interchange, said gate comprising a hairpin element of conductive material provided on the first level and being mounted on said planar layer of magnetic material, said hairpin element being substantially U-shaped and including a pair of elongated legs joined at one end to define a hairpin loop, said legs being asymmetrical so as to respectively include offset portions with width variations, and a pair of enlarged pads disposed at the ends of the elongate legs opposite from the hairpin loop, the second level of said gate being disposed at the same level as said minor propagation path and said input/output track and including a hook-like transfer element disposed at one end of the minor propagation path and forming a bight of the loop defined thereby, the opposite ends of said hook-like transfer element being respectively disposed in the opposite courses of the loop defined by said minor propagation path, said hook-like element including an intermediate leg portion thereof disposed in overlapping relation to the hairpin loop region of said hairpin element, first and second spacer elements disposed at said second level and respectively associated with said minor propagation path and said input/output track, a first spacer element associated with said minor propagation path being arranged on one side of said hairpin element and including an end portion interposed between a corresponding end of said hook-like element and an element of said minor propagation path, and a second spacer element being disposed on the other side of said hairpin element in off-set relation to said first spacer element and including one end portion interposed between individual bubble propagation elements included in said input/output track.

8. A magnetic bubble domain memory structure as set forth in claim 7, further including a pair of pick-off bars disposed in the second level of said gate, said pair of pick-off bars being located on opposite sides of said hairpin element in spaced relation to said first and second spacer elements respectively.

9. A magnetic bubble domain memory structure as set forth in claim 7, further including an asymmetric bubble-steering propagation element included as a component of said input/output track and of said swap transfer/replicate gate.

10. A magnetic bubble domain memory structure as set forth in claim 7, wherein a pair of said second spacer elements are provided, the other of said second spacer elements being disposed on the same side of said hairpin element with respect to said first spacer element and including one end portion interposed between individual bubble propagation elements included in said input/output track.

11. A magnetic bubble domain memory structure as set forth in claim 7, wherein said hook-like transfer element includes respective leg portions disposed at a 90° angle with respect to each other, the one of said leg portions other than the leg portion disposed in overlapping relation to the hairpin loop region of said hairpin element having a notch defined therein to provide a leg portion section of reduced width, and said leg portion section of reduced width being connected to said leg portion disposed in overlapping relation to the hairpin loop region.

12. A magnetic bubble domain memory structure as set forth in claim 2, wherein said first and second pairs of blocks included in said bubble storage section are spaced apart, said first and second pairs of bubble generators, said first and second detectors, and said input/output tracks being disposed between said first and second pairs of blocks.

13. A magnetic bubble domain memory structure as set forth in claim 12, further including first and second elongated bubble transfer conductors in operable association with said first and second pairs of blocks respectively and disposed therebetween, said input/output tracks including first and second pairs of input/output tracks respectively disposed inwardly with respect to said first and second elongated bubble transfer conductors, a bubble generator operably associated with each of said input/output tracks included in said first and second pairs of input/output tracks, and said first and second detectors being respectively connected to said first and second pairs of input/output tracks.

14. A magnetic bubble domain memory structure as set forth in claim 13, wherein said swap transfer/replicate gate means comprises a plurality of swap transfer/replicate gates corresponding to each of said minor propagation paths included in said first and second pairs of blocks, and said swap transfer/replicate gates straddling said first and second elongated bubble transfer conductors and being operably connected at their opposite ends with the corresponding one of said input/output tracks and said minor propagation path.

* * * * *